(12) United States Patent
Lambert

(10) Patent No.: US 9,823,898 B2
(45) Date of Patent: Nov. 21, 2017

(54) TECHNIQUE FOR DETERMINING NONLINEAR ORDER-SEPARATED RESPONSES OF NONLINEAR SYSTEMS INCLUDING LINEAR RESPONSE AT SYSTEM TYPICAL INPUT LEVELS

(71) Applicant: HARMAN INTERNATIONAL INDUSTRIES, INC., Stamford, CT (US)

(72) Inventor: Russell H. Lambert, Highland, UT (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 105 days.

(21) Appl. No.: 14/871,861

(22) Filed: Sep. 30, 2015

(65) Prior Publication Data

US 2017/0090870 A1    Mar. 30, 2017

(51) Int. Cl.
*G06F 17/14* (2006.01)
*G06F 7/544* (2006.01)
*G06F 17/50* (2006.01)

(52) U.S. Cl.
CPC ............. *G06F 7/544* (2013.01); *G06F 17/50* (2013.01)

(58) Field of Classification Search
CPC  G05B 2219/41415; G06F 7/544; G06F 17/50

USPC ................... 708/300–323, 400–410
See application file for complete search history.

(56) References Cited

U.S. PATENT DOCUMENTS

| 2004/0258250 | A1* | 12/2004 | Gustafsson | ............. G10H 1/16 381/61 |
| 2011/0270590 | A1* | 11/2011 | Aparin | ............... G06K 9/00496 703/2 |

* cited by examiner

*Primary Examiner* — Tan V. Mai
(74) *Attorney, Agent, or Firm* — Artegis Law Group, LLP

(57) ABSTRACT

A software application characterizes a nonlinear system by applying a series of test signals at full power and performing an algorithm on the resulting outputs to determine the true linear response and the order-separated outputs. The application generates a baseline test signal, multiplied by a gain factor. The application inputs the test signal to the system to produce a response. The application then generates another test signal by multiplying the baseline signal by a different gain factor. The application iterates generating test signals by multiplying by differing gain factors. The application then constructs a Vandermonde matrix of the gain factors, computes the inverse Vandermonde matrix, and convolves the inverse Vandermonde matrix with a matrix of the system responses to each of the test signals. The elements of the resulting convolution represent the order-separated outputs including the linear response output of the nonlinear system at full power.

20 Claims, 4 Drawing Sheets

TECHNIQUE FOR DETERMINING NONLINEAR ORDER-SEPARATED RESPONSES OF NONLINEAR SYSTEMS INCLUDING LINEAR RESPONSE AT SYSTEM TYPICAL INPUT LEVELS

BACKGROUND

Field of the Various Embodiments

The various embodiments generally relate to systems analysis and, more specifically, to a technique for determining linear responses of nonlinear systems.

Description of the Related Art

One objective of systems analysis is to identify an input/output relationship for a linear or non-linear system. In a linear system, the output is directly proportional to the input multiplied by a fixed gain factor plus some fixed offset. In a nonlinear system, the output to input relationship may be expressed as a polynomial that includes higher powers of the input, each multiplied by coefficients that may vary, or even be zero. Many nonlinear systems exist, and physical devices typically have nonlinear characteristics beyond a limited range of linear operation. Meteorological systems, communications channels, and audio loudspeakers are examples, without limitation, of well-known nonlinear systems.

Analysis of a nonlinear system typically involves constructing a linear model of the system and then determining the linear characteristics of the model to assess quality or performance. Similarly, synthesis of a nonlinear system of typically involves constructing a linear model. Both analyses and syntheses of nonlinear systems utilize mathematical techniques to construct linear approximations to the nonlinear system.

Fourier analysis is a well-known mathematical systems analysis technique that involves decomposing a signal applied as an input to a nonlinear system into a series of sine waves. The series of sine waves includes a fundamental, or first order, component, and other higher order harmonics. A nonlinear system responds to the higher order harmonics with a different gain factor than the fundamental component and with a different gain factor than lower order harmonics. Thus, through the different gain factor, the nonlinear system generates an output that includes nonlinear distortions of the input signal.

Analyzing the quality or performance of a nonlinear system typically includes determining the linear characteristics of the system. In that regard, when synthesizing systems that are inherently nonlinear, a primary objective is to measure a result that is either linear or as close to linear as possible. Measurement of the linear response for a nonlinear system typically entails sending an extremely low level test signal through the nonlinear device under test.

Another technique to determine the linearity of a nonlinear system includes attenuating the input signal by a factor large enough to ensure that the signal always remains in the limited linear region of operation. The resulting output is then scaled up by the inverse of the attenuation factor to yield an input-output relationship that represents the linear response of the system. This approach simply avoids the nonlinear characteristics of the system and, thus, can give an unrealistic or substantially limited representation of the nonlinear system.

As the foregoing illustrates, what would be useful is a more effective technique for analyzing the linear response of nonlinear systems across a broader range of operating conditions.

SUMMARY

One embodiment sets forth a non-transitory computer-readable medium that, when executed by a processor, configures the processor to characterize a nonlinear system, by performing the steps of applying a first signal to the nonlinear system, generating a first response of the nonlinear system to the first signal, applying a second signal to the nonlinear system, generating a second response of the nonlinear system to the second signal, constructing a first set that includes the first signal and the second signal, constructing a second set that includes the first response and the second response, and constructing a third set based on the first set and the second set, wherein the third set characterizes the nonlinear system.

At least one advantage of the disclosed techniques is that the linear response of a nonlinear system may be determined using a full power input signal, thereby allowing measurement to include all factors that contribute to the linear response while using full power inputs.

Another advantage of the disclosed technique is that all the nonlinear order responses can be separated, such that the linear response contains only linear information, i.e. it contains only a first order Volterra kernel, meaning that Volterra estimation yields only non-zero coefficients for the first order kernel. Similarly, the second order response contains only quadratic information, i.e. contains only a second order Volterra kernel. Likewise again, for all nonlinear orders, the disclosed technique will allow the separation of nonlinear effects such that the Nth order response will contain only Nth order information such that the signal has only an Nth order Volterra kernel.

BRIEF DESCRIPTION OF THE SEVERAL VIEWS OF THE DRAWINGS

So that the manner in which the recited features of the one more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

DETAILED DESCRIPTION

Figure 1:
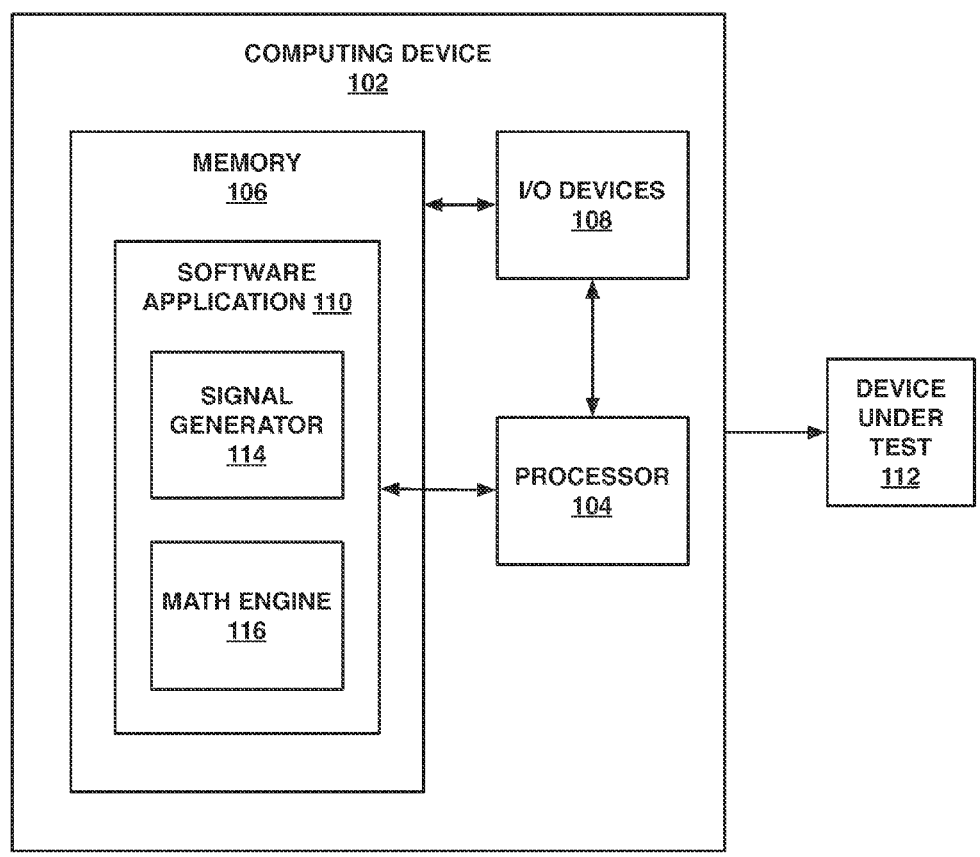
FIG. 1 illustrates a computing device configured to implement one or more aspects of the various embodiments.

In the following description, numerous specific details are set forth to provide a more thorough understanding of certain specific embodiments. However, it will be apparent to one of skill in the art that other embodiments may be practiced without one or more of these specific details or with additional specific details FIG. 1 illustrates a computing device 102 configured to implement one or more aspects of the various embodiments. As shown, computing device 102 includes, without limitation, processor 104, input/output (I/O) devices 108, and memory 106. Memory 106 includes software application 110, which, in turn, includes signal generator 114, and math engine 116. Computing device 102 is coupled to device under test 112.

Software application 110 is an analysis tool that provides stimulus, examines response, and computes characteristics of device under test 112. Software application 110 includes program code that, when executed by processor 104, causes signal generator 114 to output stimulus to device under test 112 to induce the linear response of device under test 112 at full input power. Software application 110 examines the response of device under test 112 and provides input to math engine 116, which computes characteristics of device under test 112.

In operation, signal generator 114 within software application 110 generates a complement of test signals that include magnitudes within the input range of device under test 112 and that may include any frequency content. As an example, without limitation, the test signals may include full volume audio signals. Each of the complement of test signals represents a baseline signal with a different gain factor, as described in detail below in conjunction with FIG. 2.

Signal generator 114 then outputs each test signal to the device under test 112 as a stimulus. Device under test 112 may be, for example without limitation, a loudspeaker or compression driver, or any nonlinear system. Signal generator 114 determines the response of device under test 112, to each of the test signals. Math engine 116 within software application 110 then constructs a matrix that outputs the separated nonlinear order responses to the set of the scaled test signals with gain factors 206, as described in detail below in conjunction with FIG. 3.

With this approach, math engine 116 constructs a matrix that includes the linear response of the nonlinear system. The resulting matrix may facilitate analysis of physical systems, such as, for example and without limitation, audio transducers or loudspeakers, or of simulated or virtual nonlinear systems. Further, with sufficient computing resources, the resulting order-separated outputs may facilitate synthesis and/or nonlinear correction/linearization of physical or virtual nonlinear systems.

Figure 2:
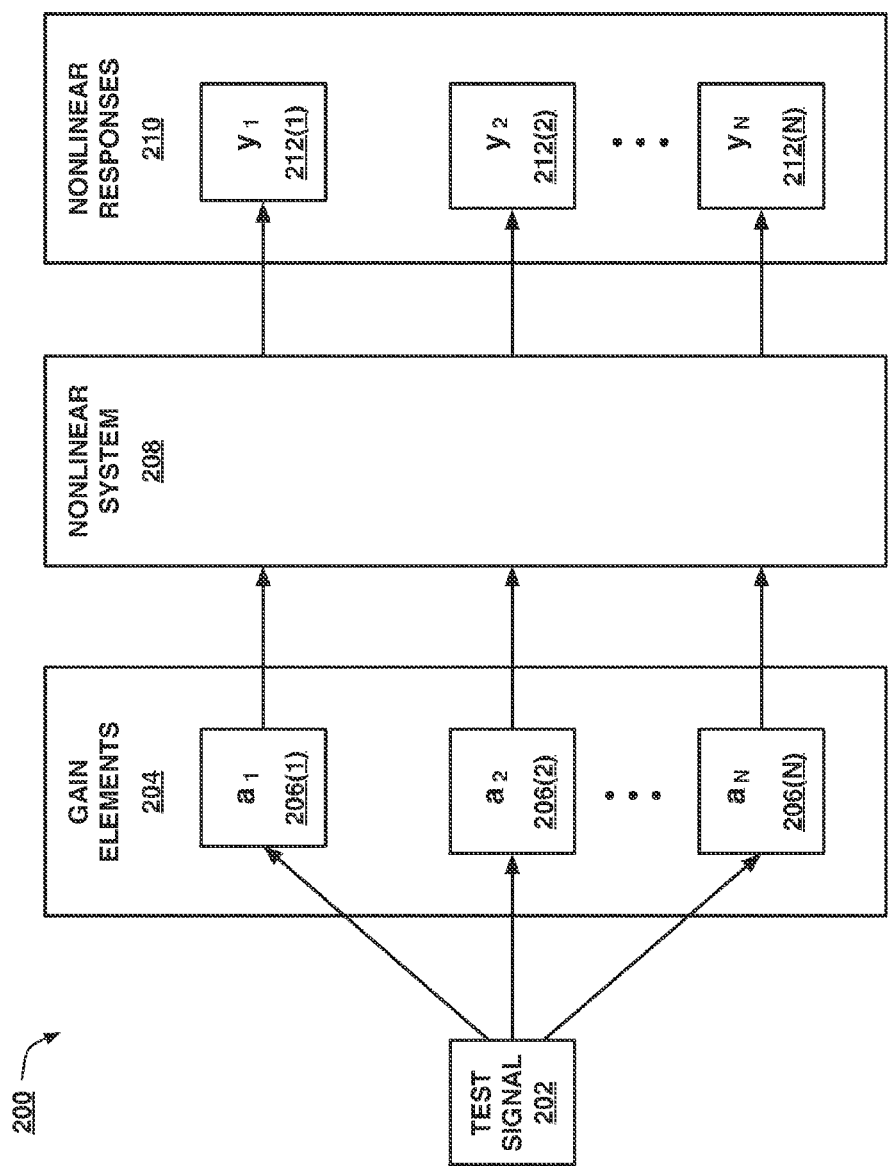
FIG. 2 illustrates processing stages associated with determining an output of a nonlinear system, according to the various embodiments.

FIG. 2 illustrates processing stages 200 associated with determining the output of a nonlinear system 208, according to the various embodiments. Signal generator 114 within software application 110, when invoked by processor 104, executes the illustrated processing steps. As shown, test signal 202 is an input to processing stages 200. As further shown, processing stages 200 include gain elements 204, and nonlinear system 208. Gain elements 204 include first gain factor 206(1), second gain factor 206(2), through Nth gain factor 206(N). Nonlinear responses 210 include the first system response using the first gain factor 206(1), yielding the output signal 212(1), the second system response using gain factor 206(2), yielding output signal 212(2), and likewise through the Nth system response using the Nth gain factor 212(N), yielding the Nth output signal 212(N).

Signal generator 114 generates test signal 202, and then amplifies test signal 202 using gain elements 204. In doing so, signal generator 114 applies each gain factor 206, in turn, to test signal 202 to generate N output responses. Signal generator 114 then generates the first system response output signal 212(1), the second system response output signal 212(2), and other system response coefficients through the Nth system response output signal 212(N).

System response output signals 212 are then output to further processing stages in which the system response coefficients 212 are convolved with an inverse Vandermonde matrix, as described in detail below in conjunction with FIG. 3.

Figure 3:
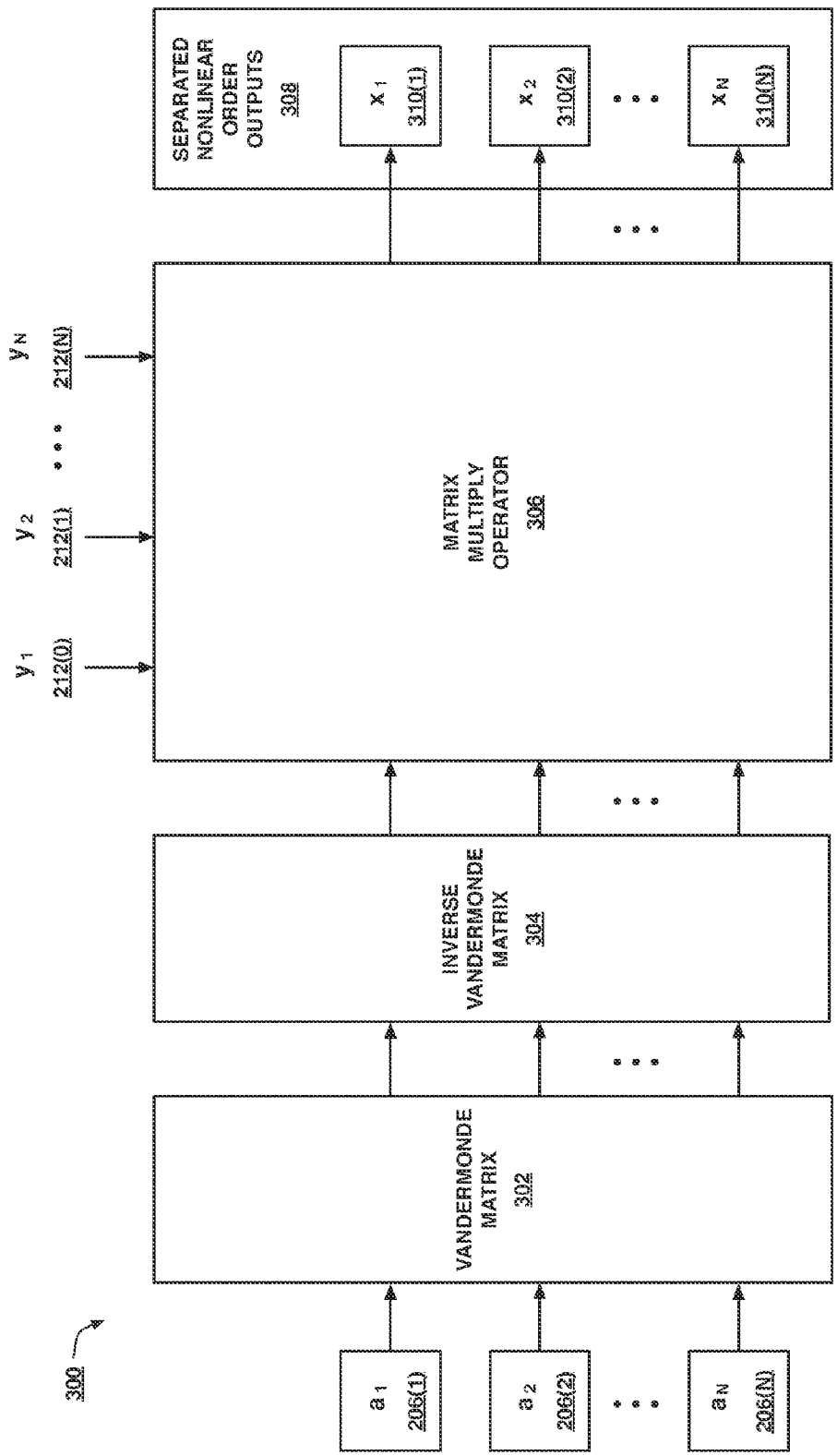
FIG. 3 illustrates processing stages associated with determining the separated nonlinear order outputs of a nonlinear system (including the linear output obtain using a full power input signal), according to the various embodiments.

FIG. 3 illustrates processing stages 300 associated with determining the separated nonlinear order outputs 308 of nonlinear system 208 (including the linear output obtain using a full power input signal), according to the various embodiments. Math engine 116, when executed by processor 104, performs processing stages 300. As shown, gain factors 206 and system response coefficients 212 are inputs to processing stages 300. As further shown, processing stages 300 include Vandermonde matrix 302, inverse Vandermonde matrix 304, matrix multiply operator 306, and separated nonlinear order outputs 308, which further include linear output coefficients 310.

In operation, math engine 116 constructs a matrix of gain factors 206 and constructs the Vandermonde matrix 302 of the gain factors 206. The first element of the first row of Vandermonde matrix 302 is simply gain factor 206(1). The second element of the first row of Vandermonde matrix 302 is gain factor 206(1) squared. The Nth element of the first row of Vandermonde matrix 302 is gain factor 206(1) raised to the Nth power.

Similarly, the first element of the second row of Vandermonde matrix 302 is simply gain factor 206(2). The second element of the second row of Vandermonde matrix 302 is gain factor 206(2) squared. The Nth element of the second row of Vandermonde matrix 302 is gain factor 206(2) raised to the Nth power.

Finally, the first element of the Nth row of Vandermonde matrix 302 is simply gain factor 206(N). The second element of the Nth row of Vandermonde matrix 302 is gain factor 206(N) squared. The Nth element of the Nth row of Vandermonde matrix 302 is gain factor 206(N) raised to the Nth power.

Math engine 116 computes the inverse Vandermonde matrix 304 of gain factors 206. Math engine 116 then convolves the set of system response output signals 212 with the inverse Vandermonde matrix 304 to generate the order-separated output signals 310. Linear output 310(1) represents the true linear output signal of nonlinear system 208 (the first order response output signal). Second order output 310(2) represents the true second order output signal of nonlinear system 208. Linear output 310(N) represents the true Nth order linear output signal of nonlinear system 208. Signal generator 114, thus, applies full power signals to nonlinear system 208 and performs a mathematical algorithm to generate the order-separated output signals 310 (including the linear response output signal,) of nonlinear system 208 at full power. Separation of the order components can simplify characterization of the nonlinear system.

Figure 4:
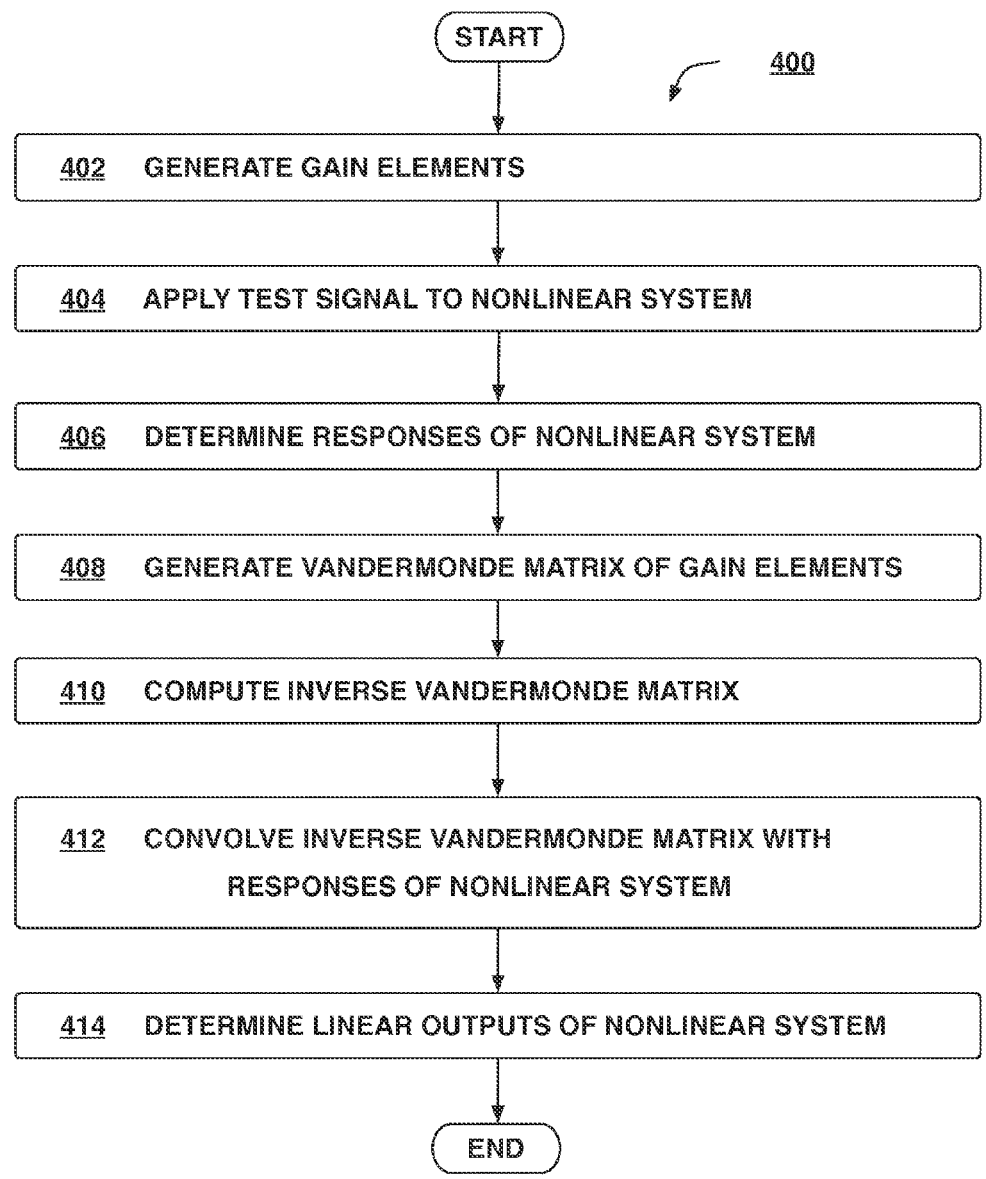
FIG. 4 is a flow diagram of method steps for determining the separated nonlinear outputs of a nonlinear system, according to the various embodiments.

FIG. 4 is a flow diagram of method steps for determining the linear outputs of a nonlinear system 208, according to the various embodiments. Although the method steps are described in conjunction with the systems of FIGS. 1-3, persons skilled in the art will understand that any system configured to perform the method steps, in any order, is within the scope of the various embodiments.

As shown, a method 400 begins at step 402, where signal generator 114 within software application 110, when invoked by processor 104, generates a set of gain elements 204 with various gain factors 206. At step 404, signal generator 114 within software application 110 applies, in turn, a series of test signals where each test signal includes a baseline signal, of any form or frequency content, multiplied by each gain element.

At step 406, math engine 116 within software application 110 determines the responses of nonlinear system 208 to each of the amplified test signals. At step 408, math engine 116 within software application 110 generates the Vandermonde matrix 302 of the gain factors 206. At step 410, math engine 116 within software application 110 computes the inverse Vandermonde 304 matrix of the gain factors 206. At step 412, math engine 116 within software application 110 convolves the inverse Vandermonde 304 matrix of the gain factors 206 with the responses of the nonlinear system 208 to each of the amplified test signals.

At step 414, math engine 116 within software application 110 determines the linear outputs of the nonlinear system by constructing a matrix of the results of matrix multiply operator 306. Software application 110 may then create an accurate model that includes the order-separated outputs 310 derived from stimulus of the system scaled by the set of gains 206, many or all of which may be at a level in the full power operating region of the nonlinear system under test.

In sum, a software application characterizes a nonlinear system by applying a series of test signals at full power and performing an algorithm on the resulting outputs to determine the true linear response and the order-separated outputs. The application generates a baseline signal, and multiplies the baseline signal by a gain factor to generate a test signal. The application inputs the test signal to the system to produce a response. The application then generates another test signal by multiplying the baseline signal by a different gain factor. The application iterates generating test signals by multiplying by differing gain factors. The application then constructs a Vandermonde matrix of the gain factors, computes the inverse Vandermonde matrix, and convolves the inverse Vandermonde matrix with a matrix of the system responses to each of the test signals. The elements of the resulting convolution represent the order-separated outputs including the linear response output of the nonlinear system.

Advantageously, the techniques disclosed herein allow a substantial improvement in the accuracy of determining the linear response of nonlinear systems. The disclosed techniques can generate accurate characterization of the response of a system under realistic, full power operating conditions. As an example, consider that in an audio loudspeaker, using very low input signal amplitudes, there will be very little thermal heating. It may be advantageous to measure the linear response in the presence of the full power thermal heating. Further, given adequate computing resources, the disclosed techniques may facilitate the synthesis of both physical and simulated nonlinear systems The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A non-transitory computer-readable medium that, when executed by a processor, configures the processor to characterize a nonlinear system, by performing the steps of:
   applying a first signal to the nonlinear system;
   determining a first response of the nonlinear system to the first signal;
   applying a second signal to the nonlinear system;
   determining a second response of the nonlinear system to the second signal;
   computing a characteristic of the nonlinear system based on the first signal, the second signal, the first response, and the second response; and
   generating a plurality of order separated output signals for the nonlinear system based on the characteristic.

2. The non-transitory computer-readable medium of claim 1, wherein performing the mathematical operation comprises:
   generating a first matrix based on the first signal and the second signal;
   generating a second matrix based on the first response and the second response; and
   generating a third matrix based on the first matrix and the second matrix, wherein constructing the third matrix generates the output.

3. The non-transitory computer-readable medium of claim 2, wherein generating the first matrix comprises:
   inputting the first response at a first position within the first matrix; and
   inputting the second response at a second position within the first matrix.

4. The non-transitory computer-readable medium of claim 2, wherein generating the second matrix comprises:
   constructing a Vandermonde matrix;
   inputting the first signal at a second position in a first row of the Vandermonde matrix;
   inputting the second signal at a second position in a second row of the Vandermonde matrix; and
   inverting the Vandermonde matrix to generate the second matrix.

5. The non-transitory computer-readable medium of claim 2, wherein generating the third matrix comprises performing a convolution of the first matrix and the second matrix.

6. The non-transitory computer-readable medium of claim 1, further comprising determining the linear gain of the nonlinear system based on the mathematical operation.

7. The non-transitory computer-readable medium of claim 1, wherein the second signal comprises the first signal multiplied by a gain factor.

8. The non-transitory computer-readable medium of claim 1, wherein the nonlinear system comprises a loudspeaker.

9. A method for characterizing a nonlinear system, the method comprising:
   applying a first signal to the nonlinear system;
   determining a first response of the nonlinear system to the first signal;
   applying a second signal to the nonlinear system;
   determining a second response of the nonlinear system to the second signal;
   computing a characteristic of the nonlinear system based on the first signal, the second signal, the first response, and the second response; and
   generating a plurality of order separated output signals for the nonlinear system based on the characteristic.

10. The computer-implemented method of claim 9, wherein the first signal comprises an audio signal.

11. The computer-implemented method of claim 9, wherein performing the mathematical operation comprises:
    generating a first matrix based on the first signal and the second signal;
    generating a second matrix based on the first response and the second response; and
    generating a third matrix based on the first matrix and the second matrix, wherein constructing the third matrix generates the output.

12. The computer-implemented method of claim 11, wherein generating the first matrix comprises:
    inputting the first response at a first position within the first matrix; and
    inputting the second response at a second position within the first matrix.

13. The computer-implemented method of claim 11, wherein generating the second matrix comprises:
    constructing a Vandermonde matrix;
    inputting the first signal at a second position in a first row of the Vandermonde matrix;
    inputting the second signal at a second position in a second row of the Vandermonde matrix; and
    inverting the Vandermonde matrix to generate the second matrix.

14. The computer-implemented method of claim 9, further comprising determining the linear gain of the nonlinear system based on the mathematical operation.

15. The computer-implemented method of claim 9, wherein the nonlinear system operates at a maximum magnitude; and the magnitude of the second signal is equal to the maximum magnitude.

16. A computing device that characterizes a nonlinear system, comprising:
    a memory that includes a software application; and
    a processor that is coupled to the memory and, when executing the software application:
    applies a first signal to the nonlinear system;
    determines a first response of the nonlinear system to the first signal;
    applies a second signal to the nonlinear system;
    determines a second response of the nonlinear system to the second signal;
    computes a characteristic of the nonlinear system based on the first signal, the second signal, the first response, and the second response; and
    generates a plurality of order separated output signals for the nonlinear system based on the characteristic.

17. The system of claim 16, wherein the nonlinear system comprises a communications channel.

18. The system of claim 16, wherein computing a characteristic of the nonlinear system comprises:
    generating a first matrix based on the first signal and the second signal;
    generating a second matrix based on the first response and the second response; and
    generating a third matrix based on the first matrix and the second matrix, wherein constructing the third matrix generates the output.

19. The system of claim 18, wherein generating the second matrix comprises:
    constructing a Vandermonde matrix;
    including the first signal at a second position of a first row of the Vandermonde matrix;
    including the second signal at the second position of a second row of the Vandermonde matrix; and inverting the Vandermonde matrix to generate the second matrix.

20. The system of claim 16, wherein the nonlinear system comprises a simulation of a physical system.

* * * * *